United States Patent [19]

Caravona

[11] Patent Number: 5,176,254
[45] Date of Patent: Jan. 5, 1993

[54] TERMINAL SUPPORT SYSTEM

[75] Inventor: Dale P. Caravona, Phoenix, Ariz.

[73] Assignee: On-Shore Technology, Inc., Tempe, Ariz.

[21] Appl. No.: 860,582

[22] Filed: Mar. 27, 1992

Related U.S. Application Data

[63] Continuation of Ser. No. 688,862, Apr. 22, 1991, abandoned.

[51] Int. Cl.⁵ .............................................. B65D 73/02
[52] U.S. Cl. ................................. 206/330; 206/328; 206/329; 206/524.7
[58] Field of Search ............... 206/328, 329, 330, 331, 206/346, 347, 524.7; 29/739, 837, 845, 874, 877; 439/83, 876, 885

[56] References Cited

U.S. PATENT DOCUMENTS

| | | | |
|---|---|---|---|
| Re. 32,540 | 11/1987 | Murphy | 206/329 |
| 4,086,066 | 4/1978 | McDermott | 206/524.7 |
| 4,420,877 | 12/1983 | McKenzie | 29/739 |
| 4,442,938 | 4/1984 | Murphy | 206/329 |
| 4,828,744 | 5/1989 | Kaufmann et al. | 206/524.7 |
| 4,844,828 | 7/1989 | Aoki | 206/524.7 |
| 4,878,851 | 11/1989 | Mullen, III | 439/83 |
| 4,887,981 | 12/1989 | Damon et al. | 206/329 |
| 4,894,031 | 1/1990 | Damon et al. | 29/874 |
| 4,913,286 | 4/1990 | Tate | 206/329 |
| 4,936,012 | 6/1990 | Shepherd | 206/329 |

OTHER PUBLICATIONS

Bivar Inc., "Wash-Away Component Mounting Spacers", Cage Code (FSCM) 32559, pp. 33 and 34, 1990.

Primary Examiner—David T. Fidei
Attorney, Agent, or Firm—Cahill, Sutton & Thomas

[57] ABSTRACT

A system for supporting a plurality of terminals to be inserted into an electrical circuit board utilizes a body of molded, water soluble, polymeric material closely encasing portions only of the terminals.

2 Claims, 1 Drawing Sheet

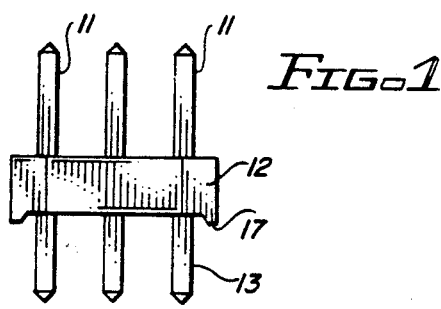
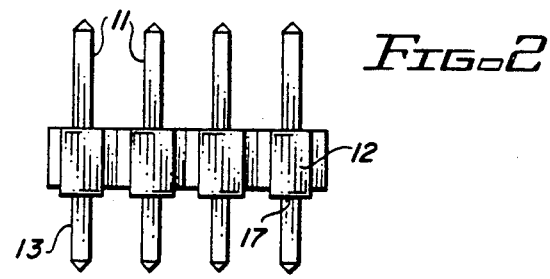
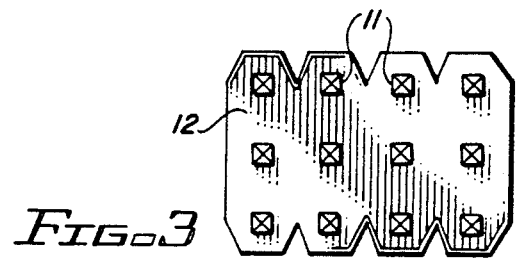
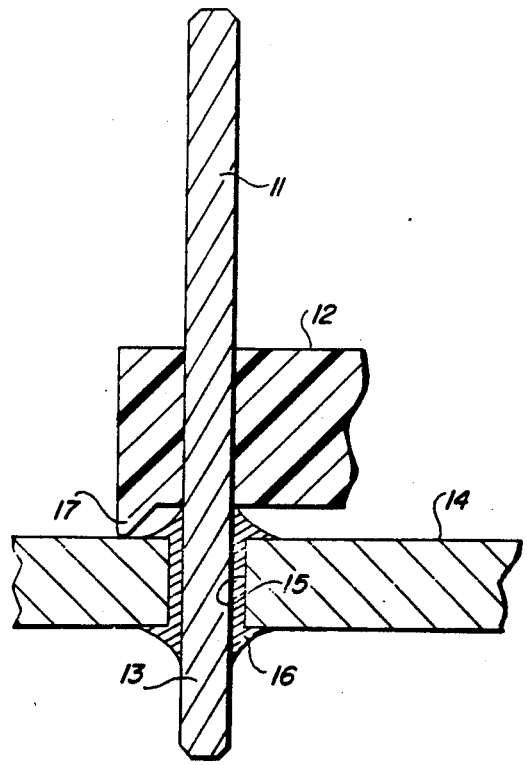
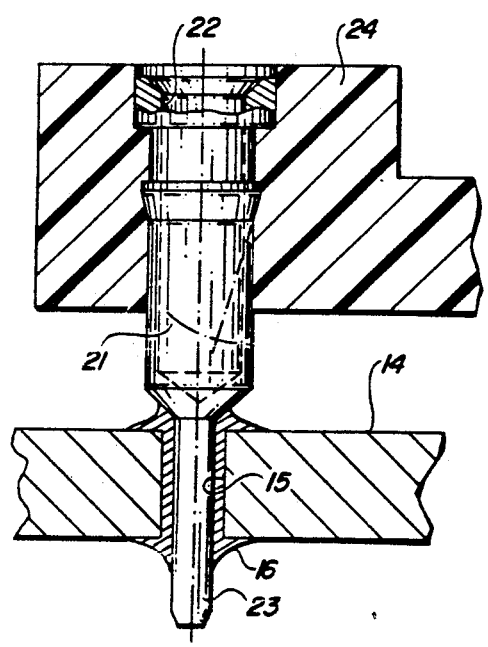

TERMINAL SUPPORT SYSTEM

This is a continuation of Ser. No. 688,862, filed Apr. 22, 1991 now abandoned.

TECHNICAL FIELD

This invention is concerned with the installation of terminals on an electrical circuit board.

BACKGROUND ART

Printed circuit boards commonly have terminals thereon, of both male and female varieties, for connecting the board circuit with other electronic components, such as potted integrated circuits. It is customary to provide an opening in the printed circuit board where a terminal is to be installed. A pin-like extension of a terminal is inserted into the opening in the circuit board and then soldered to the board.

When a plurality of terminals are to be installed in an array of predetermined configuration, it has been the practice to provide a carrier for the group of terminals, which carrier can support and transport the group in its desired configuration.

U.S. Pat. No. RE 32,540 dated Nov. 10, 1987, to J. V. Murphy for "Terminal Positioning Method and Construction" contains an excellent description of a prior art carrier system in which downwardly extending fingers on an aluminum plate enter the socket portions of an array of female terminals to support and transport the terminals. This patent also alludes to the shortcomings of the aluminum plate carrier system, such as possible damage to delicate terminals, and an inability to carry terminal arrays having more complex configurations than simple single in-line and double in-line positioning of terminals.

The Murphy patent teaches that the shortcomings of the aluminum plate carrier can be overcome by releasable retaining the terminals arranged in the desired configuration in openings provided in a thin, flexible plastic sheet. The sheet is peeled away from the terminals after the latter have been soldered to the circuit board. The problem with this approach is that the flexible sheet does not provide a stable support for the terminals with the result that the terminals can become misaligned during assembly or move during soldering, providing faulty connections.

Another common practice today is to provide rigid, molded plastic carriers for holding the terminals in the desired configuration. These carriers usually remain on the terminals after soldering, thus adding weight and taking up valuable space on the circuit board.

A somewhat different approach to terminal carrier supports is disclosed in U.S. Pat. No. 4,420,877, granted Dec. 20, 1983, to J. A. McKenzie, Jr., for "Self-Masking Socket Pin Carrier For Printed Circuit Boards". McKenzie proposes to injection mold carriers in various configurations of nylon plastic material. In order to be removable after the terminals are soldered to the board, these plastic carriers only loosely hold the terminals, again allowing possible misalignment of the terminals during transport.

U.S. Pat. No. 4,878,851, granted Nov. 7, 1989, to W. B. Mullen III for "Electrical Socket Apparatus With Temporary Housing" is concerned with printed circuit technology, but addresses a different problem. This invention seeks to prevent solder from entering the interior of an electrical socket being installed in a printed circuit board. The inventor accomplishes this objective by encasing the socket in a temporary housing shaped to fit the opening in the circuit board which receives the socket. The housing is fabricated from a soluble material which can be dissolved in a solvent, such as warm water.

Soluble spacer components have also been employed in circuit board manufacture. Bivar, Inc. of Irvine, Calif., produces a line of wash-away component mounting spacers which are sold under the trademark "DISS-O-PADS". These spacers are placed beneath electrical components, such as resistors, condensers, transistors, etc., usually around leads from such components, to space the components from the printed circuit board. The spacers are made from a sugar compound which can be dissolved in water after the components have been soldered to the board.

There continues to be a need for a terminal carrier system which reliably positions and holds terminals in a predetermined configuration during transport, assembly, and soldering and which can easily be removed from the circuit board after the soldering operation is complete.

DISCLOSURE OF THE INVENTION

The carrier system of this invention employs a body of molded, water-soluble polymeric material closely encasing portions of the terminals. The body is completely removable following soldering by the application of water.

BRIEF DESCRIPTION OF THE DRAWINGS

The invention is disclosed in greater detail hereinafter by reference to the accompanying drawings, wherein:

FIG. 1 is an end view of a carrier for an array of male terminals;

FIG. 2 is a side elevational view of the carrier;

FIG. 3 is a top view of the carrier;

FIG. 4 is an enlarged fragmentary view of the carrier illustrating the manner in which a terminal held thereon is soldered to a circuit board; and FIG. 5 is a fragmentary view of a carrier of this invention supporting a different type of terminal.

BEST MODE FOR CARRYING OUT THE INVENTION

Referring particularly to FIGS. 1 and 2, there is shown an array of twelve male terminals 11 in a triple in-line configuration. The terminals 11 have portions thereof closely encased in a carrier body 12 of molded, soluble, polymeric material. The lower ends 13 of the terminals 11 are exposed for insertion into an array of openings in a printed circuit board 14. The array of openings in the circuit board has the same configuration as the array of terminals 11.

Referring particularly to FIG. 4, there is shown but one terminal 11 inserted into a single opening 15 in circuit board 14. With carrier body 12 firmly holding and positioning the terminals 11 in the circuit board 14, the terminals are soldered in place as by means of the well-known wave soldering technique. Capillary attraction assures the formation of a solder filet 16 between the board 14 and the terminal 11, producing both an electrical and a structural bond between the two. If desired, the carrier body 12 may have feet 17 molded thereon to space body 12 a slight distance above the surface of circuit board 14 to permit maximum coating of the solder.

Following the soldering operation, the circuit board is immersed in warm water to dissolve and completely remove the carrier body 12.

Referring to FIG. 5, the system there illustrated involves the installation of a female, socket terminal 21 having an enlarged, hollow upper body 22 and a lower pin extension 23.

Terminal 21 as well as other similar terminals (not shown) are supported and carried in an array of predetermined configuration by a carrier body 24 made of molded, soluble polymeric material. Body 24 closely confines and rigidly supports a portion of the upper body 22 of terminal 21. The support leaves pin extension 22 free for insertion into an opening 15 in circuit board 14. The solder filet 16 is thereafter created between the terminal pin extension 23 and the board 14.

Again, after soldering, the carrier body 24 is completely removed from the board by washing with warm water.

The preferred material for forming carrier bodies, such as those identified at 12 and 24, is a polyvinyl alcohol copolymer compound. Air Products and Chemicals, Inc., Allentown, Pa., markets such a compound under the trademark "VINEX". The material is supplied in the form of white to off-white odorless, granular powder or pellets. The material can be molded under heat and pressure to a dense, substantially rigid body capable of giving reliable support to an array of terminals during transport (as by means of automatic transport equipment), during installation of the terminals on a circuit board and during soldering. And yet, with a simple washing operation, the carrier body can be completely removed from the circuit board.

The carrier bodies 12 and 24 can either be molded in place around the terminals or molded with openings to tightly receive the terminals. To insure that the terminals are reliably held by the carriers it is desired to press-fit the terminals into the carrier if the latter are molded separately. Because the removal of the carrier bodies is effected by dissolving them in water, a tight fit between the terminals and the bodies does not interfere with the bodies removal.

Moreover, it is to be noted that the molded carrier bodies 12 and 24 of this invention can be fabricated to any terminal array configuration and are not limited to certain in-line configurations.

From the foregoing, it should be apparent that this invention provides an improved system for supporting and transporting terminals to a circuit board.

What is claimed is:

1. A system for temporarily supporting a plurality of electrical terminals in fixed relationship to one another and in a predetermined configuration matching the configuration of a plurality of openings in an electrical circuit board, said system providing substantially rigid support for the terminals as they are transported to the circuit board, inserted into the openings in the circuit board, and soldered thereto, said system comprising a plurality of terminals and a body of molded, water soluble material closely and tightly encasing portions only of all of said terminals to provide substantially rigid support for the terminals in fixed relationship to one another and in said predetermined configuration, other portions of the terminals extending away from the body and exposed for insertion into the circuit board openings, said body being completely removable following soldering by the application of water thereto to dissolve said body.

2. The support system of claim 1, further characterized in that said body is molded from a polyvinyl alcohol copolymer compound.

* * * * *